United States Patent
Koh

(10) Patent No.: US 8,611,123 B2
(45) Date of Patent: Dec. 17, 2013

(54) COMPLEX SEMICONDUCTOR DEVICE FOR USE IN MOBILE EQUIPMENT

(75) Inventor: Yong-nam Koh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 13/215,301

(22) Filed: Aug. 23, 2011

(65) Prior Publication Data
US 2012/0063190 A1 Mar. 15, 2012

(30) Foreign Application Priority Data
Sep. 15, 2010 (KR) .......... 10-2010-0090337

(51) Int. Cl.
*G11C 5/02* (2006.01)
(52) U.S. Cl.
USPC .............................. 365/51; 365/63
(58) Field of Classification Search
USPC .................. 365/51, 63, 201, 189.2
See application file for complete search history.

(56) References Cited

U.S. PATENT DOCUMENTS

| | | | |
|---|---|---|---|
| 6,732,304 B1 * | 5/2004 | Ong .................... | 714/718 |
| 6,812,726 B1 * | 11/2004 | Ong .................... | 324/762.06 |
| 7,057,911 B2 | 6/2006 | Klint | |
| 7,167,411 B2 * | 1/2007 | Ahn .................... | 365/189.05 |
| 7,345,901 B2 * | 3/2008 | Bartley et al. ........ | 365/63 |
| 7,466,603 B2 * | 12/2008 | Ong .................... | 365/189.08 |
| 7,518,231 B2 * | 4/2009 | Dietz et al. ........... | 257/700 |
| 7,694,196 B2 | 4/2010 | Schnell et al. | |
| 7,716,411 B2 | 5/2010 | Panabaker et al. | |
| 8,355,284 B2 * | 1/2013 | Dudte et al. ........... | 365/185.18 |
| 2005/0185485 A1 * | 8/2005 | Saitoh et al. .......... | 365/201 |
| 2007/0014140 A1 * | 1/2007 | Telecco et al. ......... | 365/63 |
| 2008/0285346 A1 * | 11/2008 | Han et al. ............. | 365/185.05 |
| 2009/0055698 A1 * | 2/2009 | Resnick ............... | 714/733 |
| 2009/0161402 A1 * | 6/2009 | Oh et al. .............. | 365/51 |
| 2009/0257296 A1 * | 10/2009 | Ong et al. ............. | 365/200 |

FOREIGN PATENT DOCUMENTS

| | | |
|---|---|---|
| JP | 2009540431 | 11/2009 |
| KR | 1020050042183 A | 5/2005 |
| KR | 1020090026276 A | 3/2009 |
| WO | 2007/145883 A1 | 12/2007 |

* cited by examiner

*Primary Examiner* — Son Dinh
*Assistant Examiner* — Uyen B Tran
(74) *Attorney, Agent, or Firm* — Volentine & Whitt, PLLC

(57) ABSTRACT

Provided is a complex semiconductor device. The complex semiconductor device includes first memory chips in a first package, second memory chips in a second package configured for mass storage of data, and a controller packaged with either the first package or the second package in a complex package. The controller is connected to the first package via a first internal bus and to the second package via a second internal bus, and the first package, second package and controller are commonly packaged within a single complex package.

19 Claims, 15 Drawing Sheets

COMPLEX SEMICONDUCTOR DEVICE FOR USE IN MOBILE EQUIPMENT

CROSS-REFERENCE TO RELATED APPLICATIONS

This U.S. non-provisional patent application claims priority under 35 USC §119 to Korean Patent Application No. 10-2010-0090337, filed on Sep. 15, 2010, the subject matter of which is hereby incorporated by reference.

BACKGROUND

The inventive concept described herein generally relates to data storage devices and, more particularly, complex semiconductor devices configured for use in mobile equipment.

Cellular telephones were once used only to exchange calls and text messages, while Personal Digital Assistants (PDAs) and laptop computers served as portable computational platforms. Contemporary "mobile devices" like smartphones, tablet PCs or similar portable devices that combine telecommunications and computational functionality are capable of running a enormous variety of applications. Among other resource demands placed upon mobile devices by sophisticated applications, considerable data storage memory is required. However, conventional memory devices including single chip and multiple chips mounted within a single integrated circuit (IC) package are simply not able to meet the demands of emerging mobile devices.

Accordingly, memory devices that combine a number of memory chips with a controller have been used more recently. The collective packaging of multiple memory chips with a controller is well known in the art. Various multi-chip packages or embedded multimedia cards (hereinafter referred to as "eMMC") are examples of such semiconductor devices.

In such a semiconductor device, a multi-chip package (hereinafter referred to as "MCP") with a plurality of stacked memory chips may be connected to an external host through the controller within the eMMC. As a result, it is difficult to efficiently control this type of semiconductor device and verify operations within it. Moreover, since the constituent MCP as well as the eMMC must be separately tested prior to shipment, overall fabrication efficiency for the semiconductor device is rather low.

SUMMARY

Certain embodiments of the inventive concept provide; complex semiconductor devices capable of efficiently providing control and operational verification, complex semiconductor devices capable of efficiently operating in certain test mode(s), complex semiconductor devices capable of being incorporated within mobile devices with greater efficiently and resulting suitability across a greater range of applications, and complex semiconductor devices capable of controlling and/or testing various memory chips mounted in packages through a single controller.

Certain embodiments of the inventive concept provide operating methods and fabrication approaches for complex semiconductor devices that enable self-test and self-diagnosis based on information stored in constituent memory chips during a power-on routine.

According to an aspect of the inventive concept, a semiconductor device is configured to receive data from and communicate data to a host. The semiconductor device, comprises; a first package including a first plurality of memory chips, a second package including a second plurality of memory chips configured for mass storage of data, and a controller packaged with either the first package or the second package to form a complex package, wherein the controller is connected to the first package via a first internal bus and to the second package via a second internal bus, the first package, second package and controller are commonly packaged within a single complex package, and the host is connected to the semiconductor device via an external bus.

According to another aspect of the inventive concept, a semiconductor device is configured to receive data from a tester and comprises; a first package including a first plurality of memory chips, a second package including a second plurality of memory chips configured for mass storage of data, and a controller packaged with either the first package or the second package to form a complex package, wherein the controller is connected to the first package via a first internal bus and to the second package via a second internal bus, wherein the first package, second package and controller are commonly packaged within a single complex package, and the tester is connected to the semiconductor device via an external bus.

BRIEF DESCRIPTION OF THE DRAWINGS

The inventive concept will become more apparent in view of the attached drawings and accompanying detailed description. The embodiments depicted therein are provided by way of example and not by way of limitation. Throughout the written description and drawings, like reference numbers and labels denote like or similar elements.

DETAILED DESCRIPTION OF EMBODIMENTS

The advantages and features of the inventive concept and methods of achieving them will be apparent from the following exemplary embodiments that will be described in more detail with reference to the accompanying drawings. It should be noted, however, that the inventive concept is not limited to only the illustrated embodiments but may be implemented in various forms.

The expression "connected to" or "coupled to" that is used to designate a connection or coupling of one element or lines to a target element block includes both a case that an element or lines are "directly connected or coupled to" a target element block and a case that an element or lines are connected or coupled to a target element block via another element.

It is also to be noted that each of the embodiments described and illustrated herein may include complimentary embodiments, and general read and write operations of a RAM-based volatile memory device or a ROM-based nonvolatile memory device will be omitted to avoid ambiguous interpretation of the inventive concept.

Figure 1:
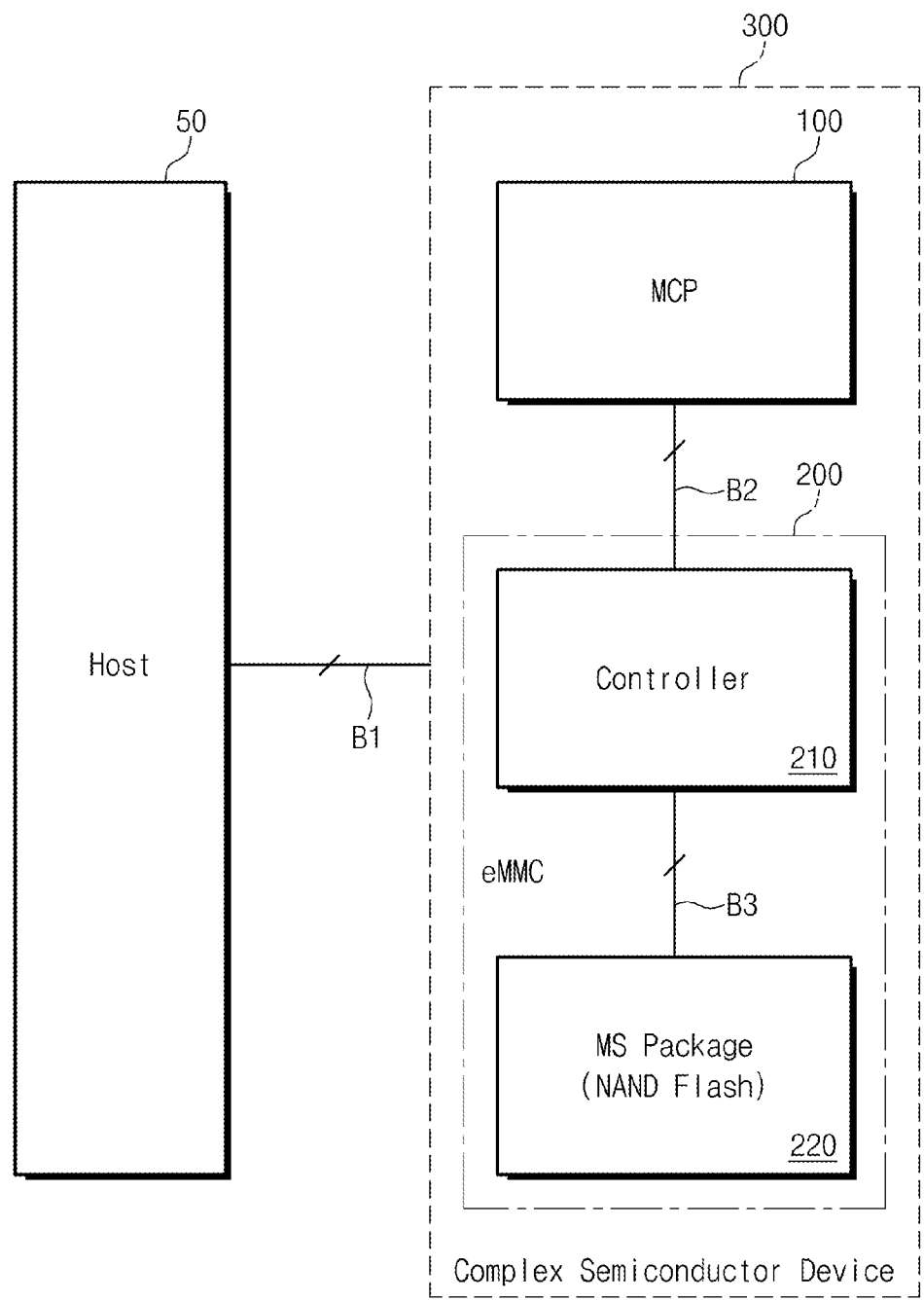
FIGS. 1 through 8 are respective circuit block diagrams of exemplary complex semiconductor devices according to embodiments of the inventive concept.

FIG. 1 is a circuit block diagram of a complex semiconductor device according to an embodiment of the inventive concept.

Referring to FIG. 1, a complex semiconductor device 300 comprises a multi-chip package (MCP) 100 and an embedded multimedia cards eMMC 200. The complex semiconductor device 300 is connected to a host 50, (e.g., a microcontroller, a central processing unit (CPU), or a memory controller) via an external bus B1. The eMMC 200 comprises a controller 210 and a mass storage (MS) memory package 220, such as a collection of NAND flash memory. The term "mass storage" in this context merely distinguishes between data used to internally run the complex semiconductor device (e.g., operating system data, application code, etc.) and user (or host) defined data that is relatively voluminous (e.g., user data files, video files, audio files, etc.). Those skilled in the art will recognize that boundaries between data types (and resulting data storage protocols) in the complex semiconductor device will vary with design and application. Suffice it to say, large or voluminous data from any source, particularly when such data is frequently accessed, may be efficiently stored in the MS package 220.

The MCP 100 may be denoted as a first chip package since it contains multiple chips functionally assembled within a single IC package. In certain embodiments of the inventive concept, the MCP 100 will include a plurality of memory chips.

Of additional note in FIG. 1, the controller 210 is connected to the MCP 100 via a first internal bus B2, and is further connected to the MS package 220 via a second internal but B3. In this context the term "external bus" is used to denote a bus structure connecting the complex semiconductor device 300 with host 50, whereas the term "internal bus" "internal buts" is used to denote a bus structure connecting elements within the complex semiconductor device 300.

Thus, despite potentially being incorporated within the eMMC package, the controller 210 functionally constitutes one complex IC unit together with the MCP 100 and another complex IC unit with the MS package 220. Accordingly, the controller 210 may be flexibly used in more suitable and efficient manners according to various applications executed by the host 50 in view of the nature of the various memory chips provided by the MCP 100 and MS package 220 using a single controller.

RAM-based volatile memory and/or ROM-based nonvolatile memory may be mounted on the MCP 100, either separately or collectively. The nonvolatile memory may be one or more selected from the group consisting of: mobile DRAM, EDP, PRAM, OneDRAM, Pseudo SRAM, LpDDR-based DRAM, FRAM, Graphic DRAM, and ReRAM. The nonvolatile memory may be one or more of selected from the group consisting of: NAND flash memory, NOR flash memory, OneNAND flash memory, PRAM, and ReRAM. The multiple nonvolatile memory chips may be mounted on the MS package 220 and arranged to function as a high-capacity (mass storage) memory.

The complex semiconductor device 300 serving as a memory storing and processing data with respect to the host 50 may be packaged using, for example, package-on-package (POP) techniques, system-in-package (SIP) techniques, etc., such that single package incorporating the entire complex semiconductor device is provided.

The external bus B1 shown in FIG. 1 may be variously implemented to connect (directly or indirectly) to at least one of the MCP 100, the controller 210, and the MS package 220 to the host 50. FIGS. 2 through 8 are circuit block diagrams further illustrating possible external bus B1 structures and internal bus structures B2, B3 that may be used in implementing embodiments of the inventive concept.

Figure 2:
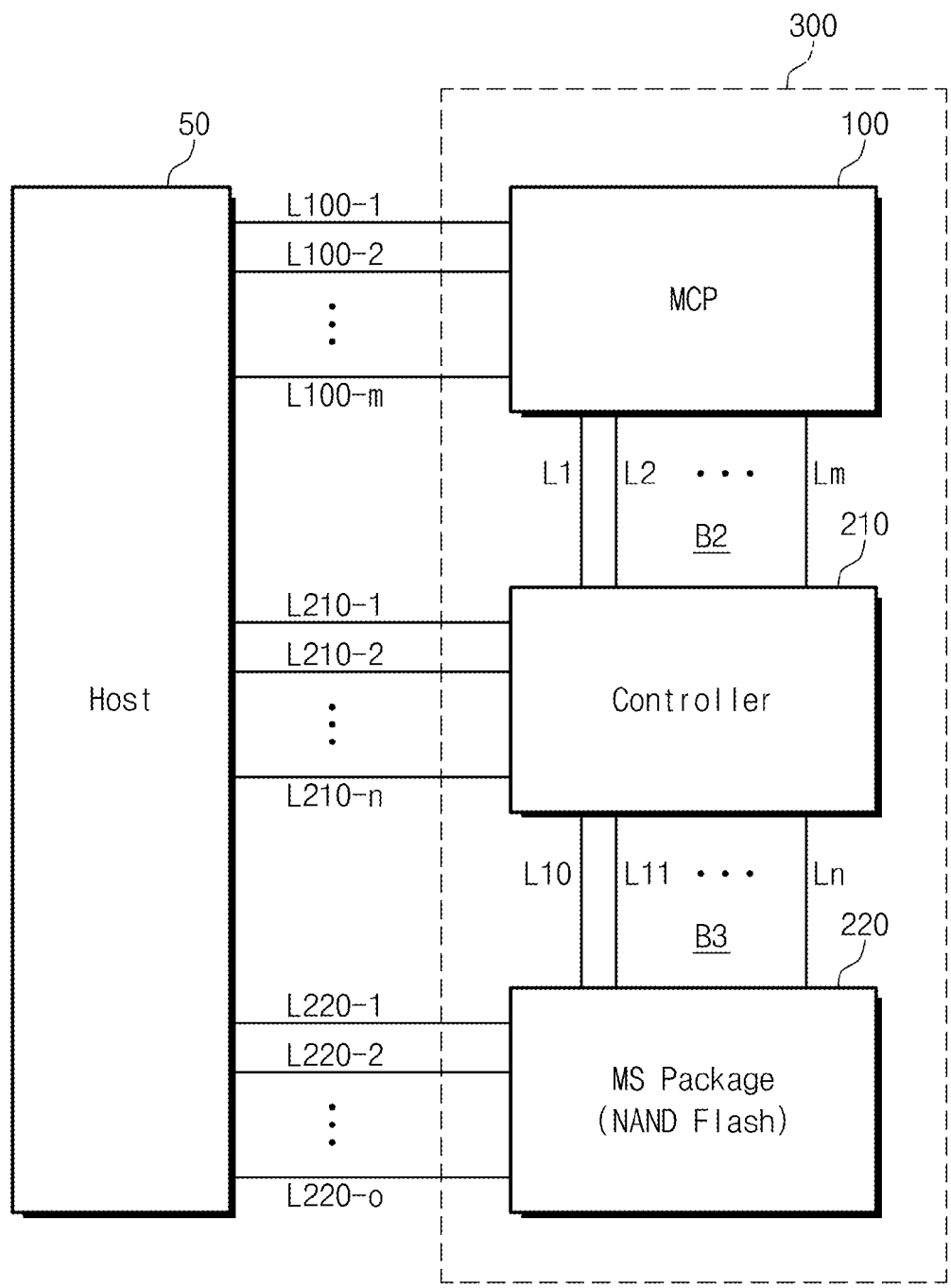

Referring to FIG. 2, the external bus line B1 directly connects to each one of the MCP 100, controller 210, and MS package 220 with the host 50. Conventionally understood buffer circuits and/or signal conditioning circuits may be included as part of connection lines L100-1, L100-2, ... and L100-m between the host 50 and the MCP 100, connection lines L210-1, L210-2, ..., and L210-n between the host 50 and the controller 210, and connection lines L220-1, L220-2, ..., and L220-o between the host 50 and the MS package 220.

Since the MCP 100 and the controller 210 are directly connected via first internal bus B2 including connection lines L1, L2, ..., and Lm, and the MS package 220 and the controller 210 are directly connected via the second internal bus B3 including connection lines L10, L11, ..., and Ln, the controller 210 is able to selectively and flexibly control both the MS package 220 and the MCP 100. Thus, when the host 50 applies a command relative to a specific task to the controller 210 through the connection lines L210-1, L210-2, ... , and L210-n, the controller 210 may control either one or both of the MCP 100 and the MS package 220. For this reason, the host 50 need not waste time and computational resources associated with directly controlling either one of the MCP 100 or the MS package 220, but host 50 may directly control these elements of the complex semiconductor device 300 as needed or desired via the connection lines of the external bus B1. As a result, the multiplicity of memory chips incorporated within the MCP 100 and MS package 220 may be efficiently controlled and/or tested using only the controller 210 in conjunction with the host 50.

Figure 3:
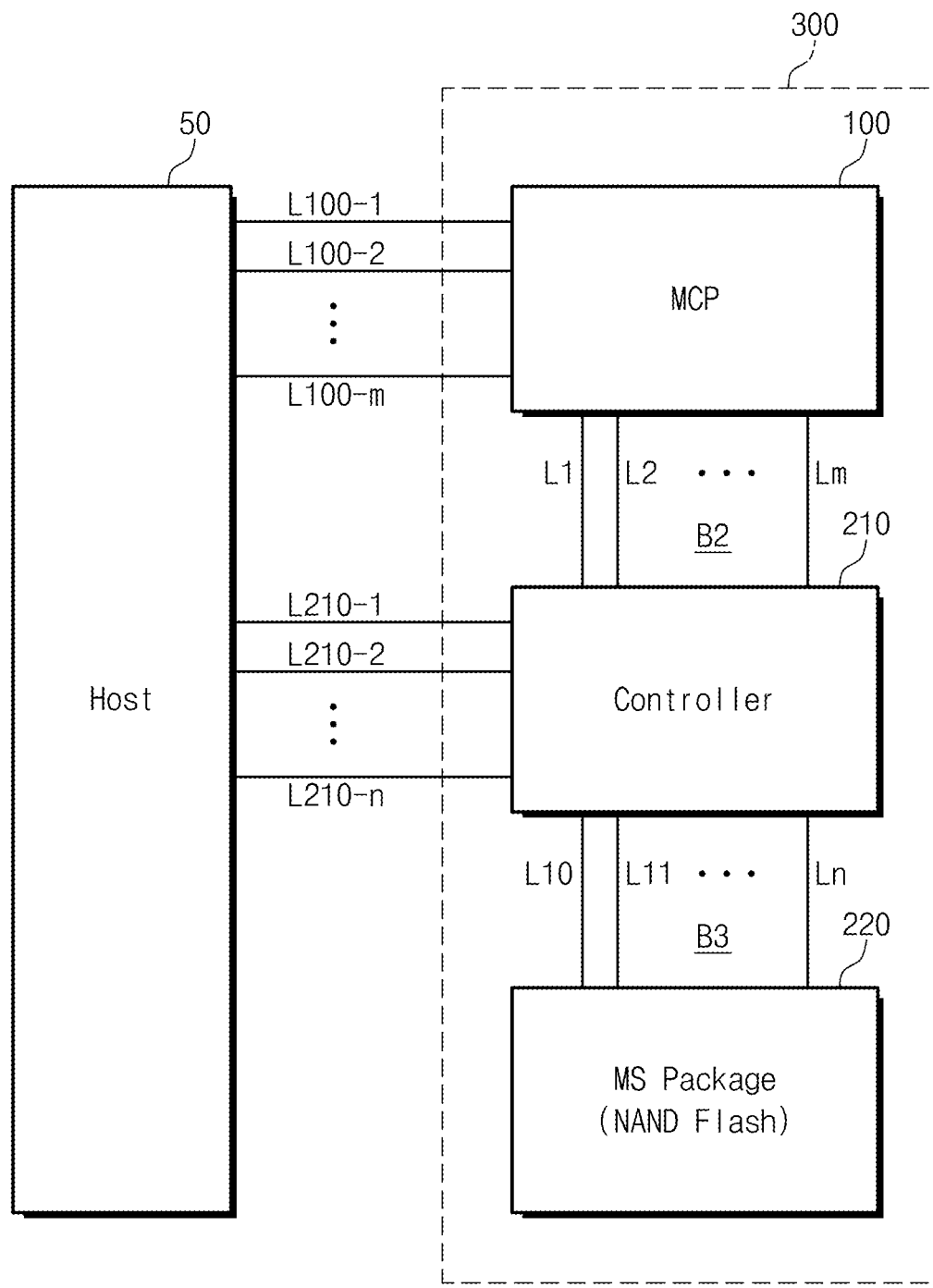

Referring to FIG. 3, an embodiment of the inventive concept is shown, wherein the external bus B1 is limited to direct connection of only the MCP 100 and the controller 210. This embodiment presupposes that only controller 210 may directly control the MS package 220. The host 50 may only indirectly control the MS package 220 through the controller 210.

Figure 4:
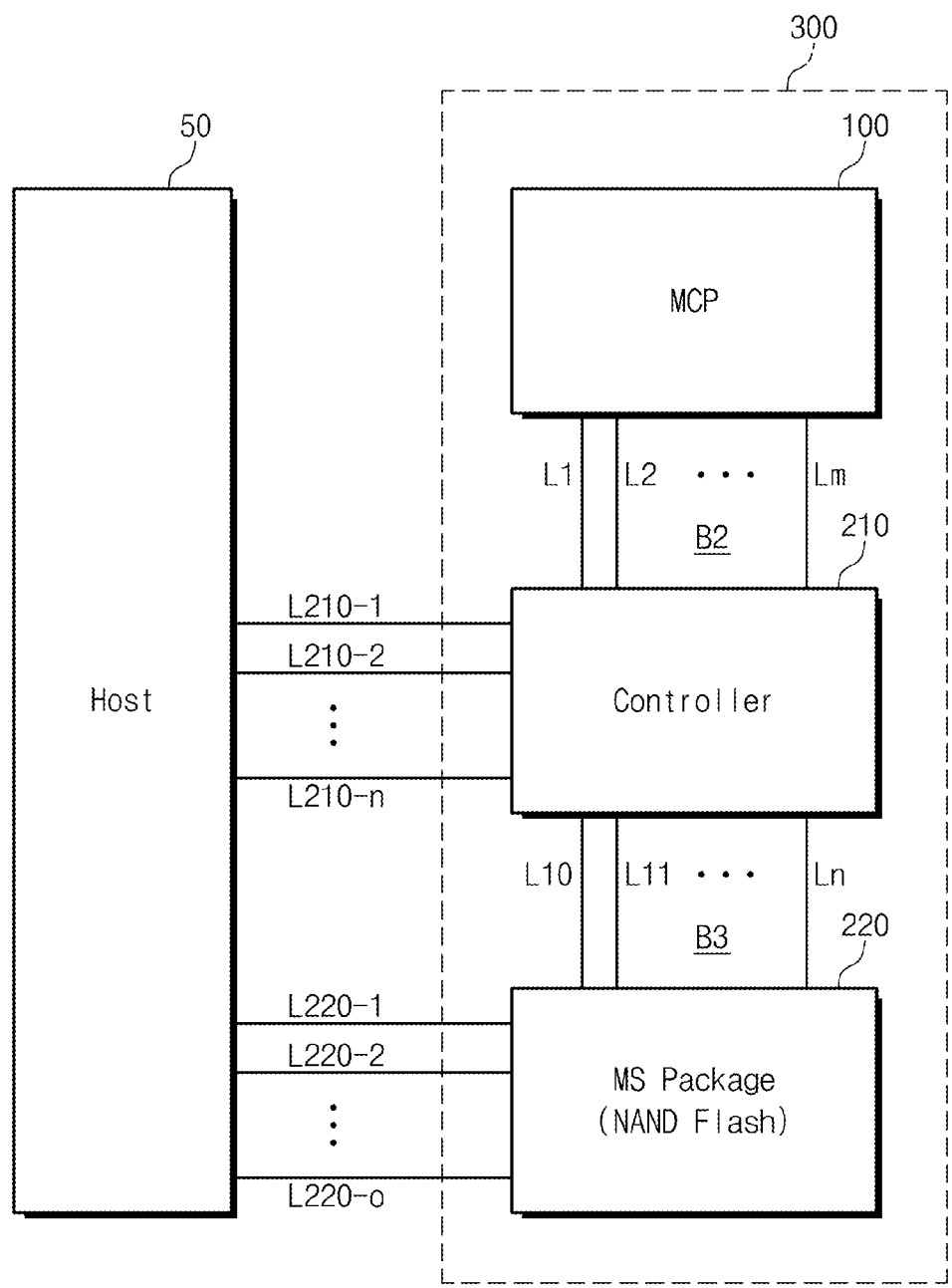

Referring to FIG. 4, an embodiment of the inventive concept is shown wherein the external bus B1 is limited to direct connection of only the MS package 220 and the controller 210. This embodiment presupposes that only controller 210 may directly control the MCP 100. The host 50 may only indirectly control the MCP 100 through the controller 210.

Figure 5:
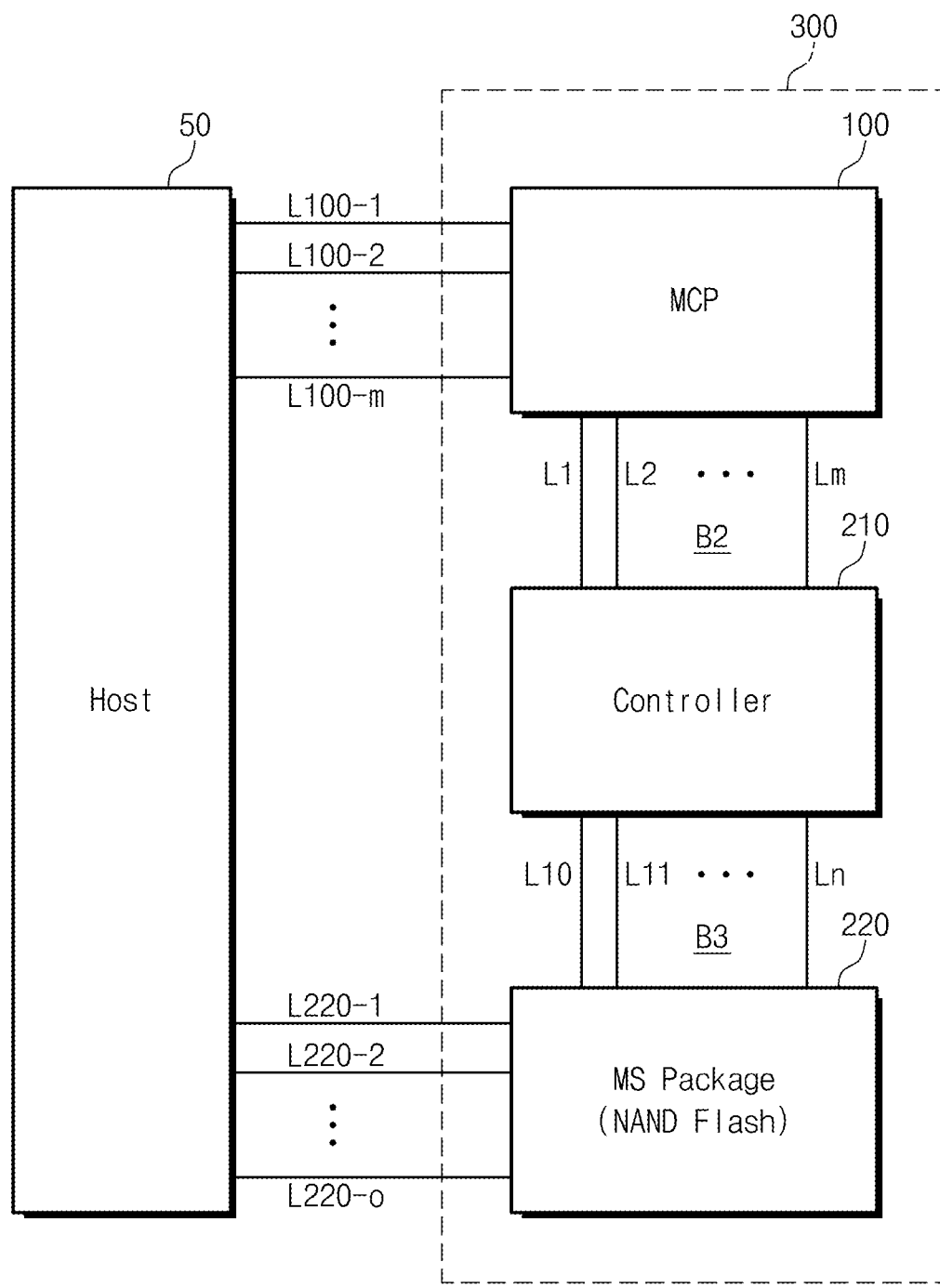

Referring to FIG. 5, an embodiment of the inventive concept is shown wherein the external bus B1 is limited to direct connection of only the MS package 220 and the MCP 100. This embodiment presupposes that the controller 210 has no direct control connection with the host 50, but that the host 50 will only directly control the MCP 100 and the MS package 220 which will run internal to the complex semiconductor device 300 in conjunction the controller 210.

Figure 6:
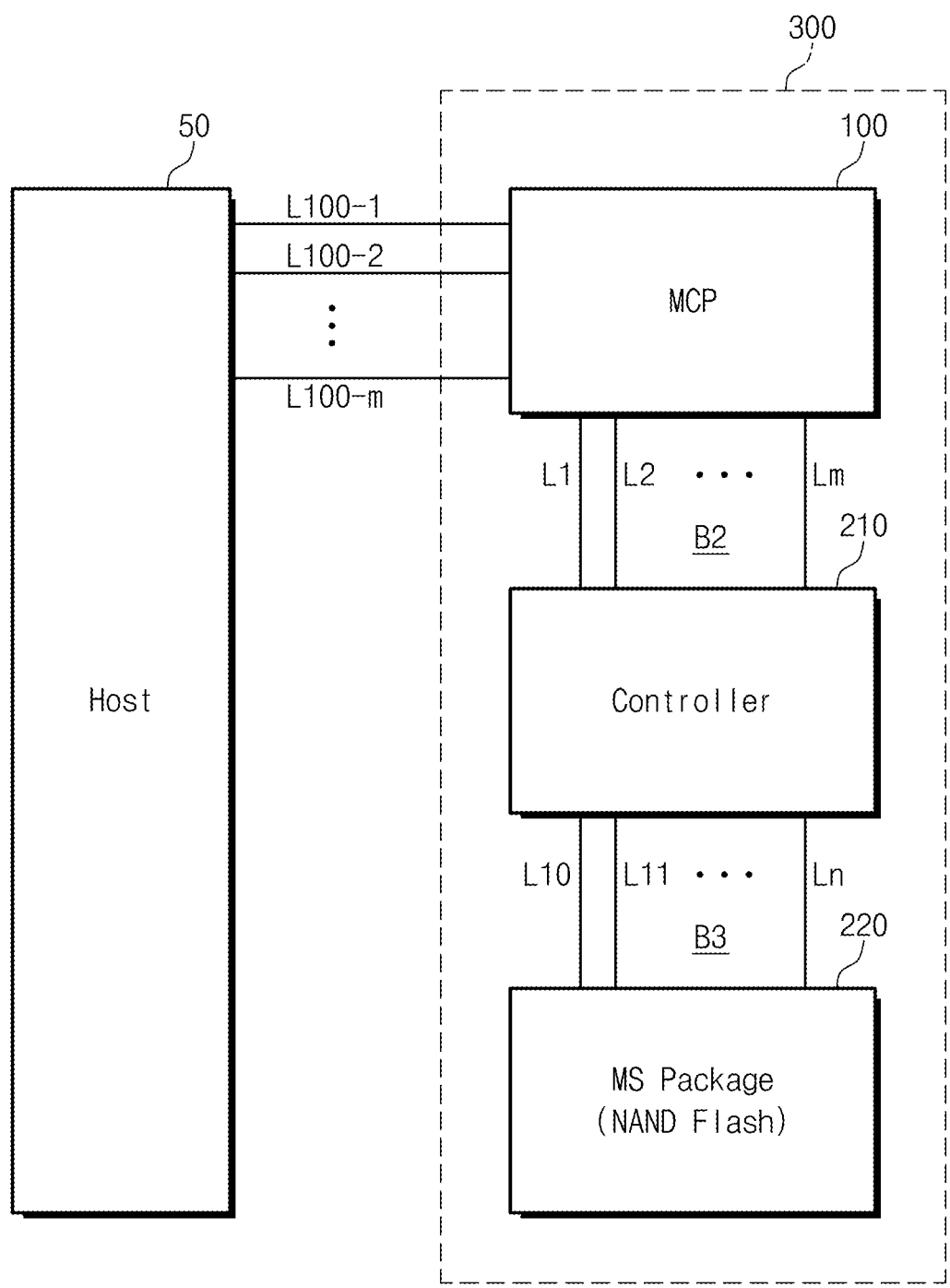
Figure 7:
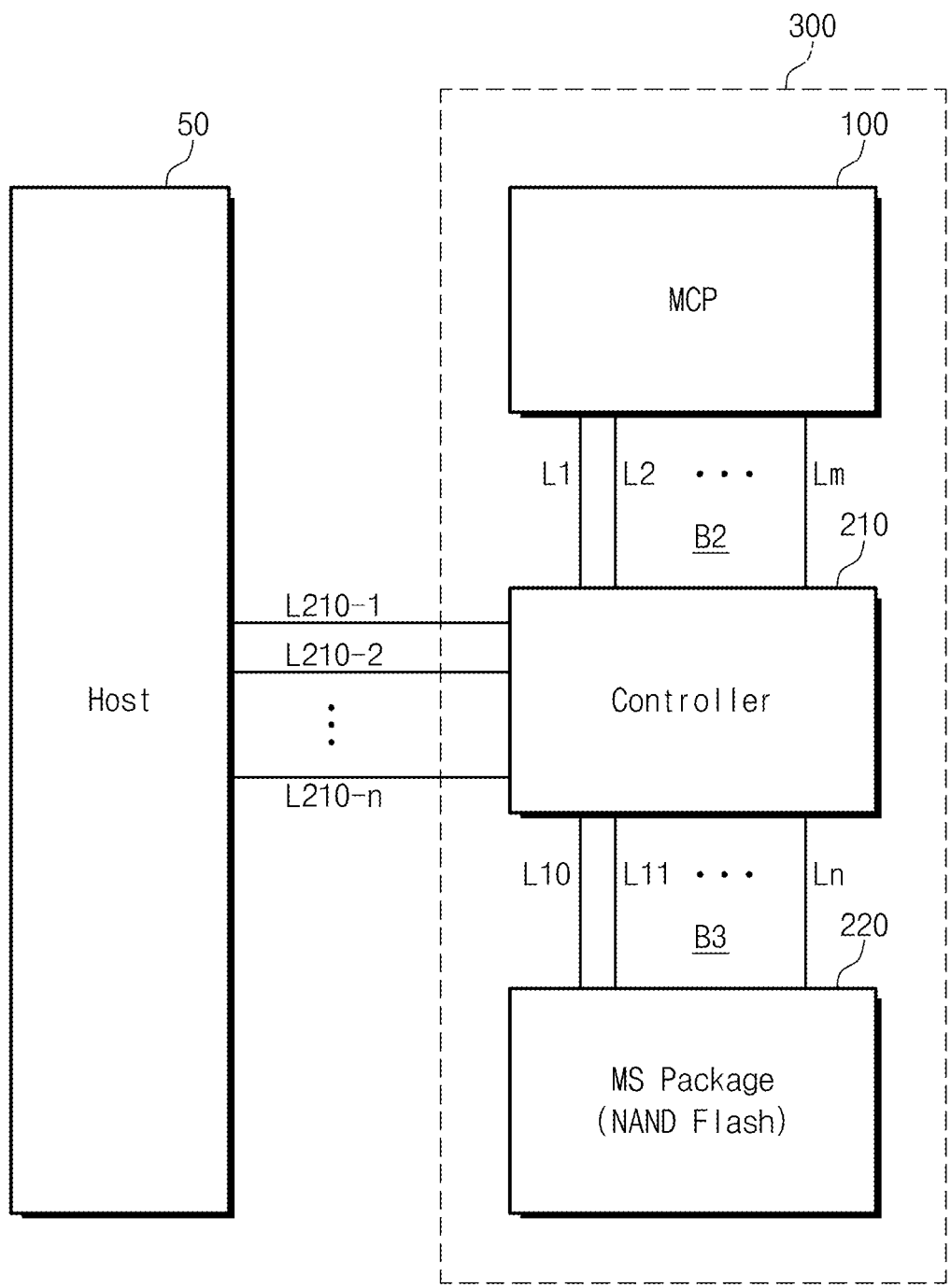
Figure 8:
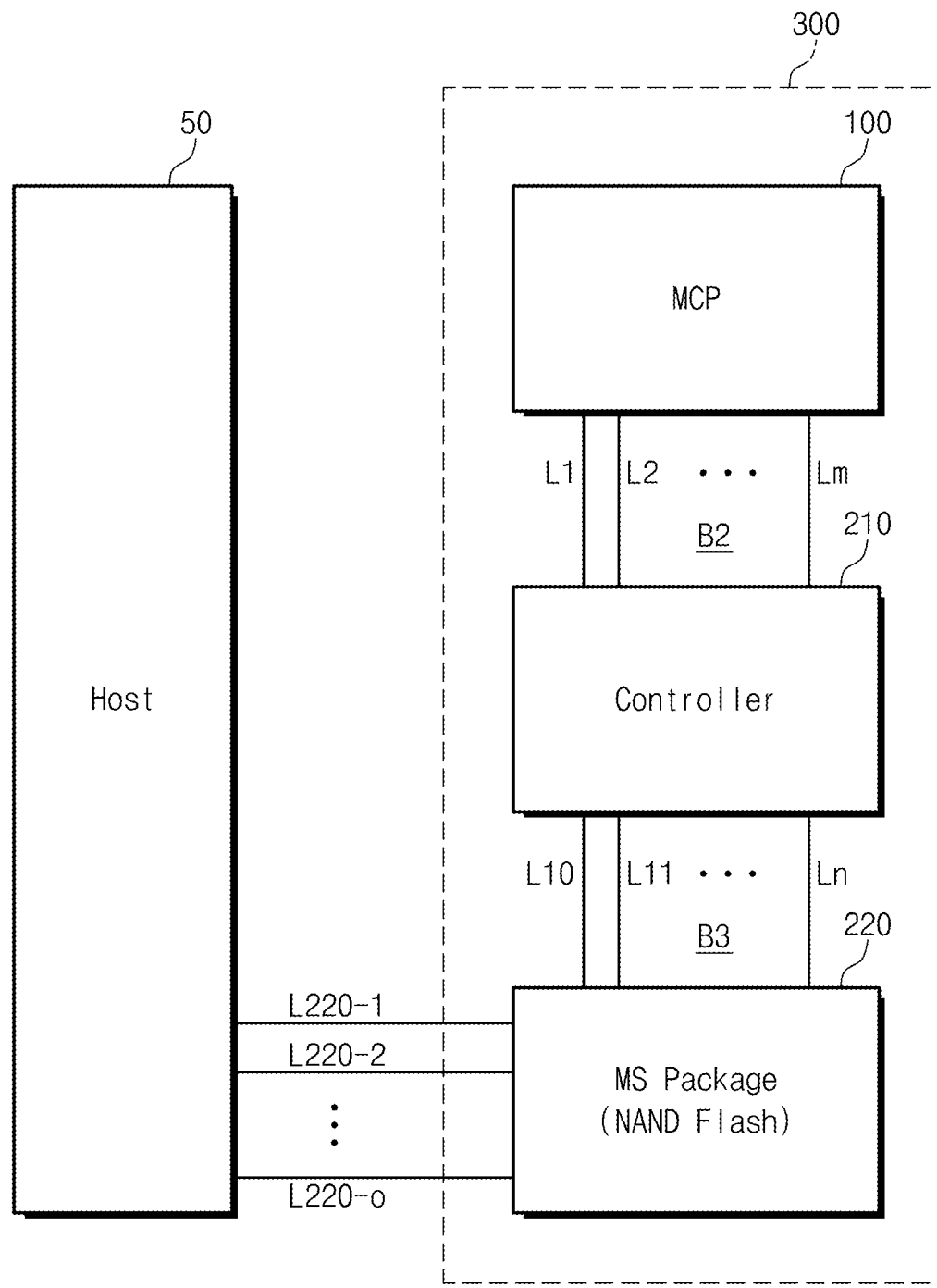

Referring to FIGS. 6, 7 and 8, embodiments of the inventive concept are shown wherein the external bus B1 is only respectively connected to either the MCP 100, the controller 210, or the MS package 220. In such embodiments, the host 50 will have only direct control over one element in the complex semiconductor device 300. All other elements will be indirectly controlled. For example, in FIG. 6 the host 50 only directly controls the MS package 50. The MCP 100 and the controller 210 are then indirectly controlled. The embodiments of FIGS. 6, 7 and 8 are particularly useful when signal line connections (e.g., I/O ports) of the host 50 are restricted in number.

Figure 9:
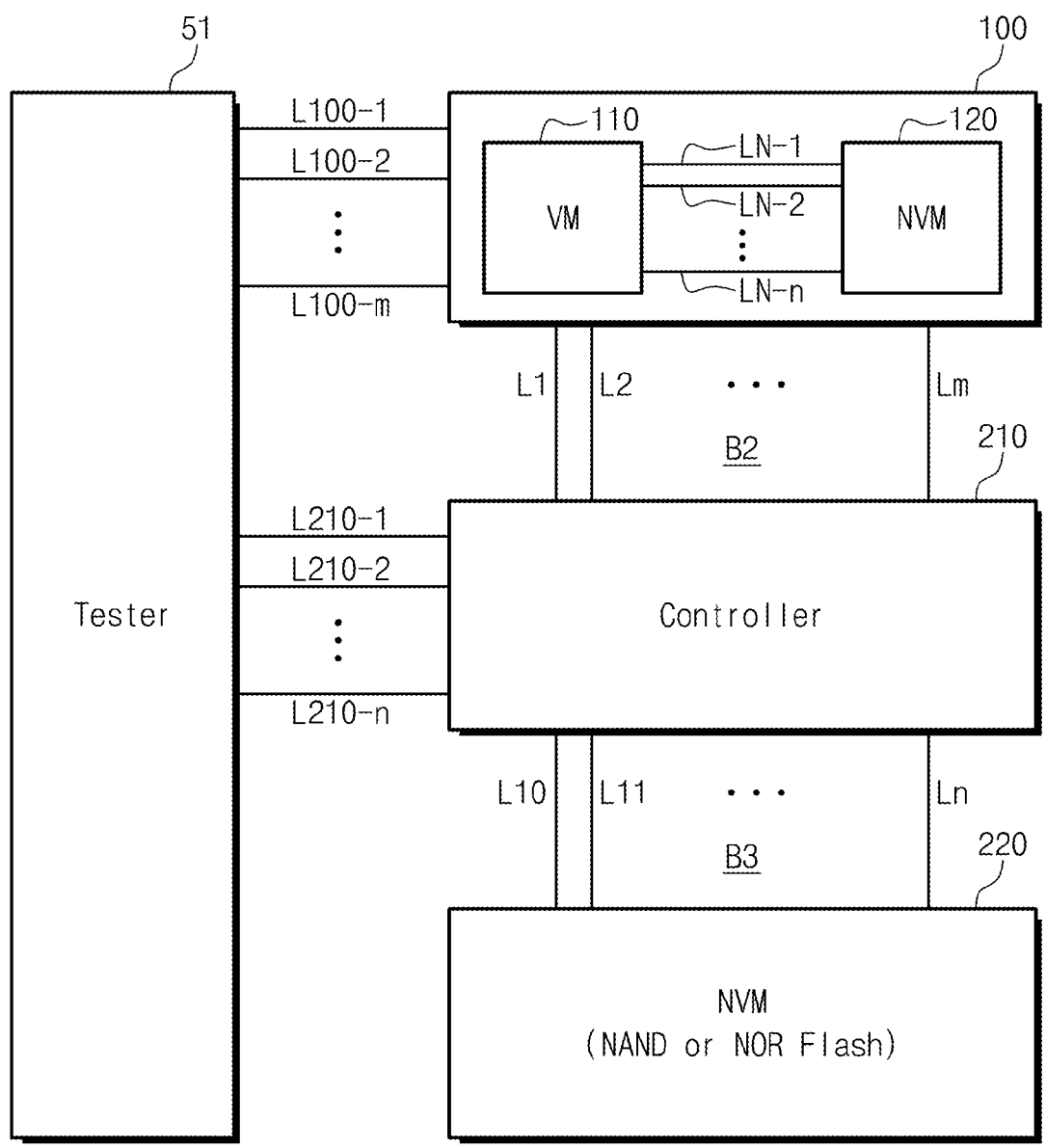
FIGS. 9 and 10 are circuit block diagrams illustrating examples of possible connections between one of the complex semiconductor device shown in FIGS. 1 through 8 and a tester.
Figure 10:
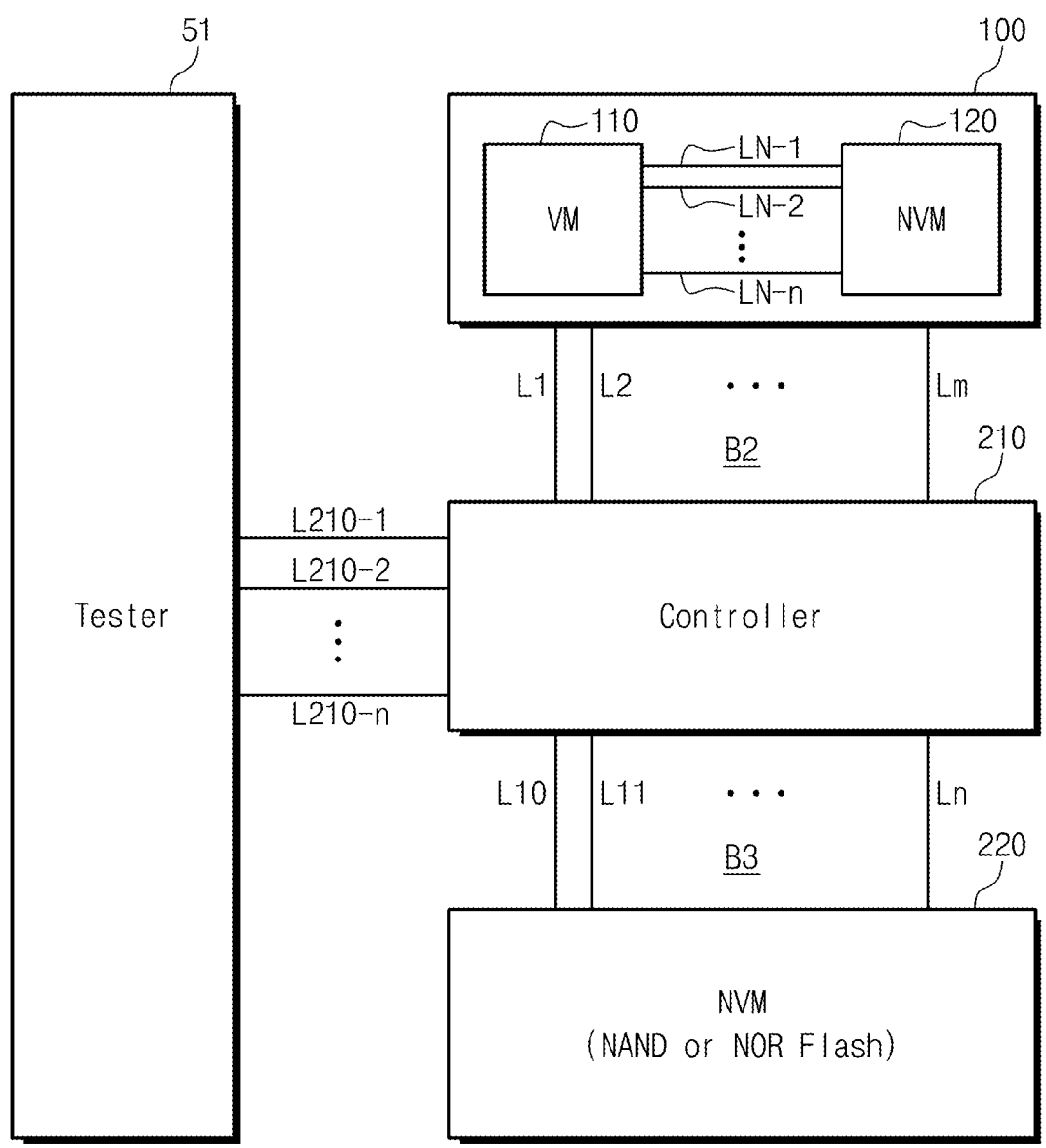

FIGS. 9 and 10 are circuit block diagrams illustrating examples of possible connections between the complex semiconductor device 300, such as the one shown in FIG. 1, and a tester 51. The embodiments of FIGS. 9 and 10 are analogous to those of FIGS. 3 and 7 with a conventionally understood tester 51 being substituted for the host 50. Further, the MCP 100 is shown in some additional detail as including both interconnected volatile memory (VM) 110 and non-volatile memory (NVM) 120, and the MS package 200 shown in the previous embodiments is replaced by a flash non-volatile memory 220. The NVM 220 may be a NAND or NOR flash memory where several to tens of layers of memory cells are stacked.

In case of FIG. 9, during a test conducted by the tester 51, the MCP 100 and a nonvolatile memory device (NVM) 220 may be tested one at time using one portion of the external bus B1 (e.g., connection lines L210-1, L210-2, . . . , and L210-$n$) without necessarily using another portion of the external bus B1 (e.g., connection lines L100-1, L100-2, . . . , and L100-$m$). In the configuration of FIG. 9, the volatile memory (VM) 110 of the MCP 100 is directly connected to the tester 51 via the external bus B1, whereas the based nonvolatile memory (NVM) 120 is indirectly connected through the volatile memory (VM) 110 and an MCP-internal but (e.g., connection lines LN-1, LN-2, . . . , and LN-$n$).

In case of FIG. 10, during a test conducted by the tester 51 or a general operation similarly conducted by later connected host, the MCP 100 and a nonvolatile memory (NVM) 200 may be separately tested and controlled using the only an external bus (e.g., connection lines L210-1, L210-2, . . . , and L210-$n$) connecting the tester 51 with the controller 210. The controller 210 may access the volatile memory 110 of the MCP 100 via the first internal bus B2, and may also store data read from the volatile memory 110 to the nonvolatile memory 120 of the MCP 100 and/or the NVM 220.

The structure illustrated in FIG. 10 overcomes the conventional disadvantage requiring the MCP 100 and the NVM 220 to be independently tested after packaging. That is, since the MCP 100 and the NVM 220 may be tested together using a common test program executed through the controller 210, overall testing operations may be made more efficient.

As mobile applications will only increase with growing demand for ever more capable smartphones and tablet PCs, simplification of the interface(s) between host and associated with complex semiconductor devices will be an important design factor. Further related methods of testing must also be considered in terms of efficiency and usefulness. Accordingly, since a complex semiconductor device according to embodiments of the inventive concept enjoys robust test performance, it may be widely used in a variety of products.

Figure 11:
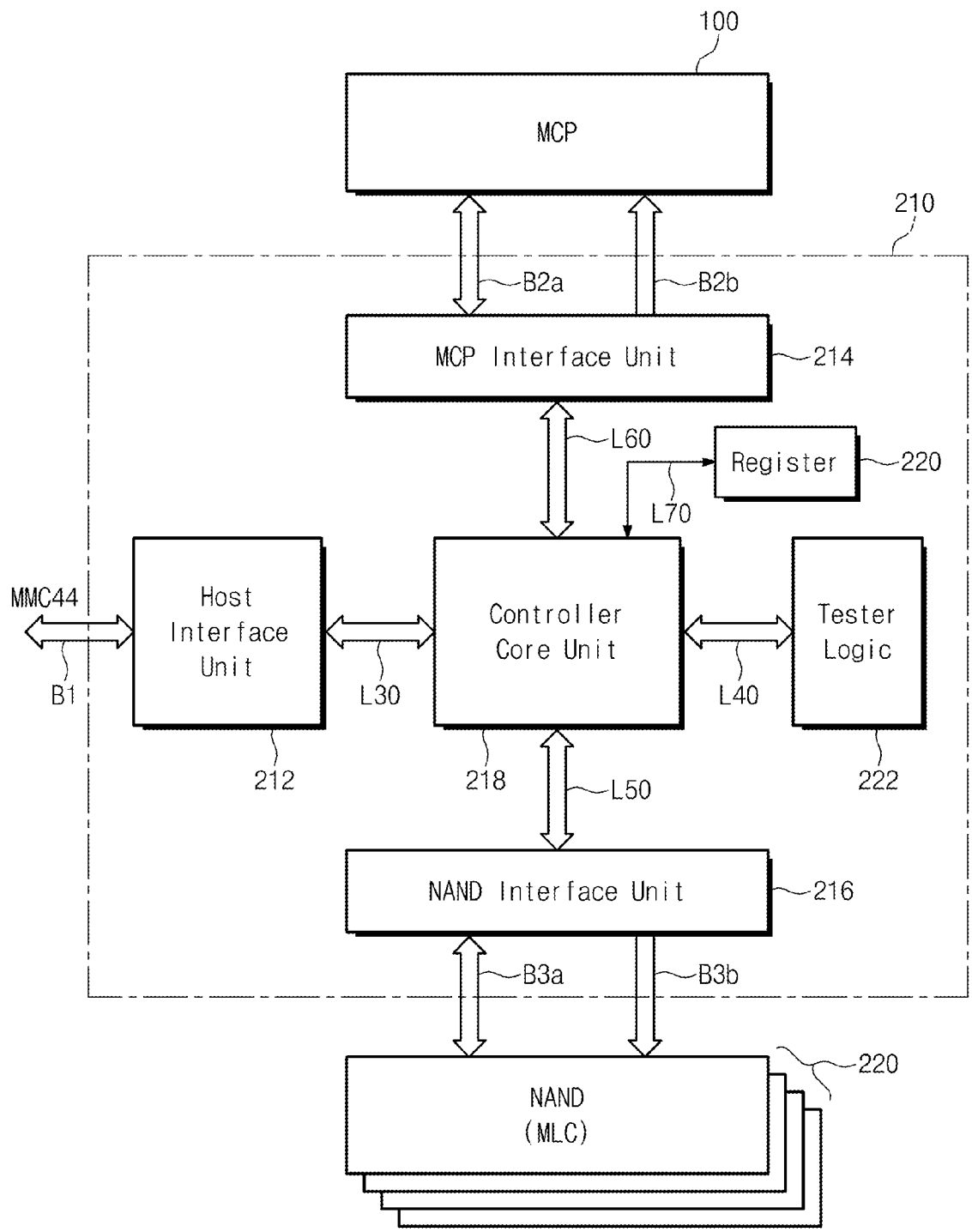
FIG. 11 is a detailed circuit block diagram illustrating one possible implementation example for the controller of FIG. 1.

FIG. 11 is a somewhat more detailed circuit block diagram illustrating one possible implementation of the controller 210 of FIGS. 1 through 10. As illustrated, the controller 210 comprises a host interface unit 212, a multi-chip package (MCP) interface unit 214, a NAND interface unit 216, tester logic 222, and a controller core unit 218.

The host interface unit 212 is connected to either the tester 51 or the host 50 and serves as a host interface, and MCP interface unit 214 is connected to the MCP 100 and serves as an MCP interface. The NAND interface unit 216 is connected to the NAND flash memory 220 and serves as a flash memory interface. In turn, the host interface unit 212 is connected to the controller core unit 218 via line L30, the MCP interface unit 214 is connected to the controller core unit 218 via line L60, and the NAND interface unit 216 is connected to the controller core unit 218 via line L50.

The tester logic 222 is connected to the controller core unit 218 via line L40 to control the execution of a test for semiconductor memory devices contained in the first and second chip packages.

The controller core unit 218 is connected to the interface units 212, 214, and 216 and the test logic unit 222 and controls the overall operation set according to embedded firmware.

In FIG. 11, a register 220 may be further provided which is connected to the controller core unit 218 to store information on test and operation execution. The register 220 is connected to the controller core unit 218 through a line L70.

The controller core unit 218 performs a control operation according to a driving program such as firmware to conveniently manage bad information of a RAM-based memory and a ROM-based memory in the MCP 100 and various types of information required for an electronic system.

In addition, since information related to all included memory chips may be accessed by a single controller, self-test and/or self-diagnosis may be performed based on the readily accessible information using an embedded tester program directly upon power-up. Thus, memory verification using an external tester is not required to ensure booting efficiency.

Figure 12:
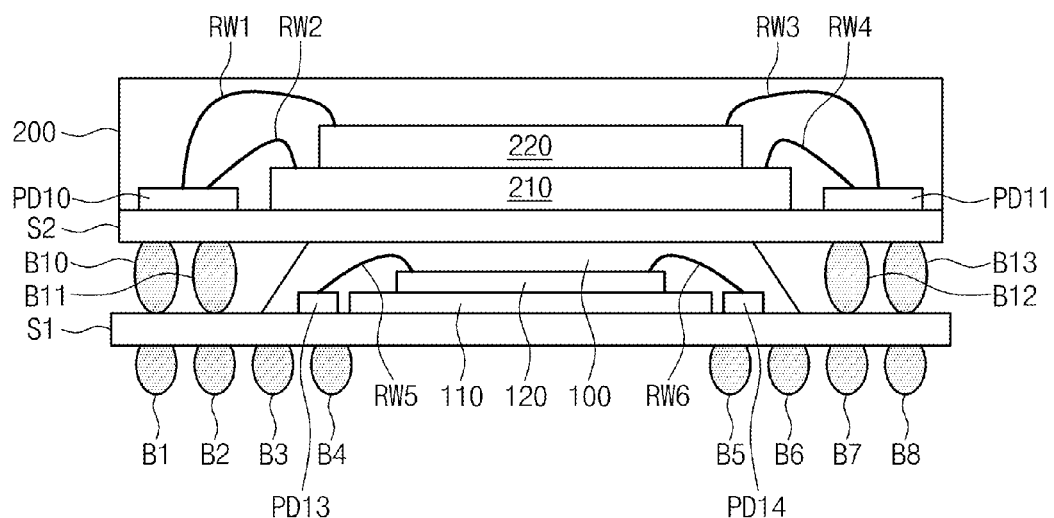
FIGS. 12 and 13 are illustrations of package structures that may be used to fabricate a complex semiconductor device such as the ones shown in FIGS. 1 through 8.
Figure 13:
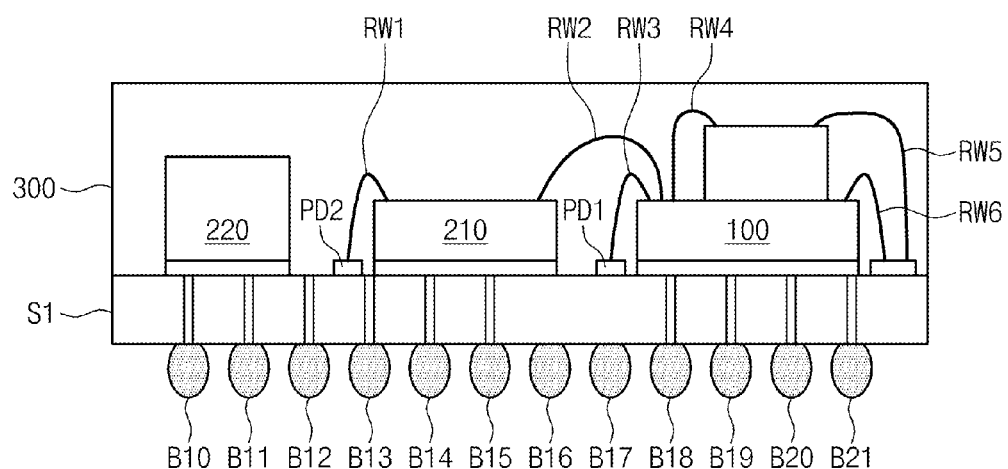

FIGS. 12 and 13 illustrate possible examples of packaging structures that may be used to implement the complex semiconductor device shown in FIGS. 1 through 10.

Referring to FIG. 12, the complex semiconductor device illustrated in FIG. 9 or 10 may be fabricated using package-on-package (POP) techniques including double-layer package substrates S1 and S2. In order to constitute one complex package, the MCP 100 including a volatile memory 110 and a nonvolatile memory 120 is mounted on the first package substrate S1 and the controller 210 and the NVM 220 are mounted on the second package substrate S2. Pads PD10 and PD11 disposed on the second package substrate S2 are connected to read wires RW1, RW2, RW3, and RW4 to take charge of electrical connection between the controller 210 and the NVM 220. Pads PD13 and PD14 disposed on the first package substrate S1 are connected to read wires RW5 and RW6 to take charge of electrical connection between the VM 110 and the NVM 120.

The controller 210 is connected to the inside and the outside of the one complex package through contact terminals B10, B11, B12, and B13 of second layer arrangement. Each of the contact terminals B10, B11, B12, and B13 may be a metal bump made of a conductive material. In FIG. 12, contact terminals B1, B, . . . , and B8 of first layer arrangement are installed to be connected to the outside of the complex package.

Alternately, the MCP 100 may be disposed below the eMMC 200.

Referring to FIG. 13, the complex semiconductor device illustrated in FIG. 9 or 10 may be fabricated using system-in-package (SIP) techniques including a single-layer package substrate S1. In order to constitute one complex package, the MCP 100, the controller 210, and the NVM 220 are horizontally mounted on the package substrate S1.

A pad PD1 and read wire RW2, RW3, RW4, RW5, and RW6 disposed on the package substrate S1 take charge of electrical connection between the controller 210 and the MCP 100. A pad PD2 and a read wire RW1 disposed on the package substrate S1 may take charge of electrical connection between the controller 210 and the NVM 220. The controller 210 is connected to the outside of the one complex package through contact terminals B10, B11, . . . , and B21 of first-layer arrangement.

Alternately, the controller 210 may be disposed between the MCP 100 and the NVM 210, or the controller 210 may be disposed to the right side of the NVM 220 or the left side of the MCP 100.

Figure 14:
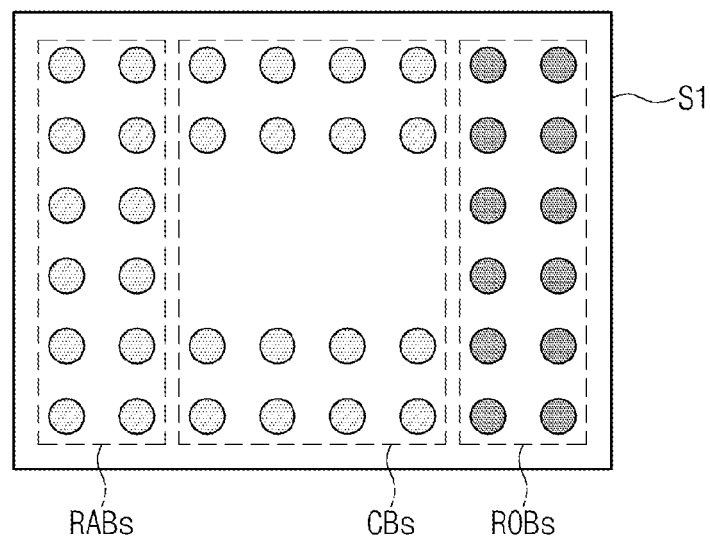
FIGS. 14 and 15 are layout diagrams illustrating possible arrangements of the contact balls shown in FIGS. 12 and 13.
Figure 15:
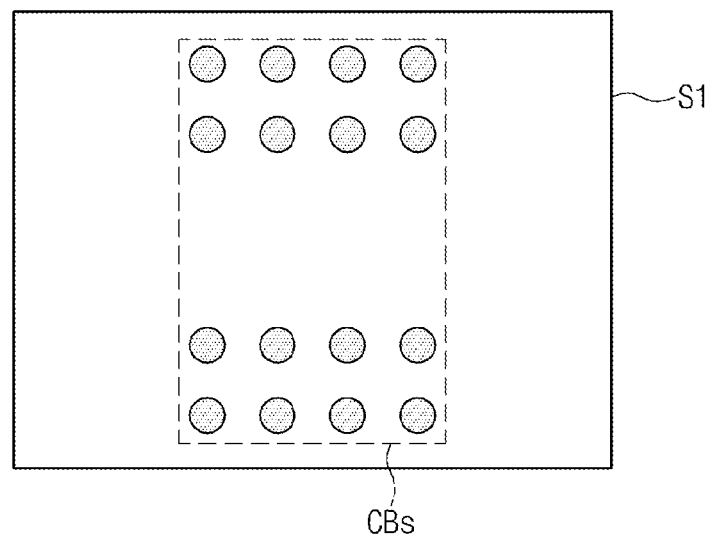

FIGS. 14 and 15 illustrate possible arrangements for the contact balls (or solder balls/bumps) shown in FIGS. 12 and 13. Referring to FIG. 14, RABs represent RAM balls for electrical contact of a RAM, CBs represent controller balls for electrical contact of a controller, and ROBs represent ROM balls for electrical contact of a ROM. The complex semiconductor device is connected to an external host or tester through these balls.

In FIG. 15, CBs represent controller balls for electrical contact of a controller. The complex semiconductor device is connected to an external host or tester through these balls.

As described in FIGS. 12 and 13, a package according certain embodiments of the inventive concept may use POP (package-on-package) techniques or an SIP (system-in-package) technique. However, the inventive concept is not limited thereto and the package may be one of Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 16:
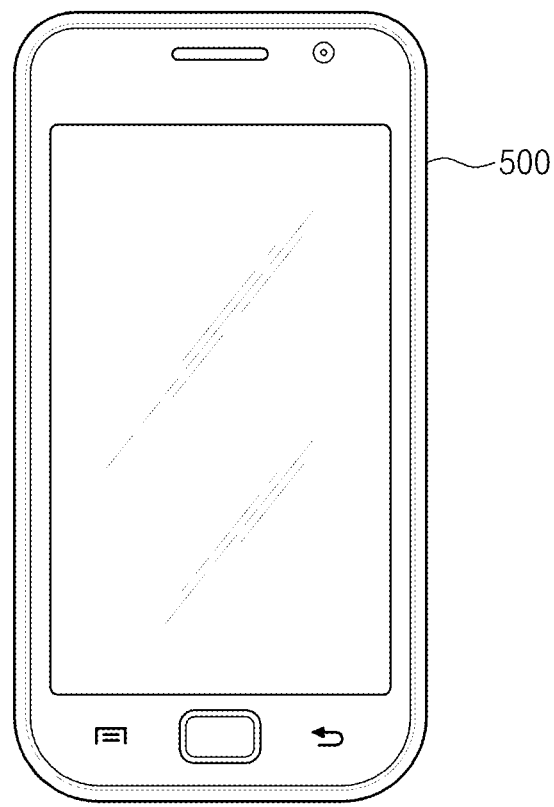
FIG. 16 illustrates one type of mobile device that may incorporate a complex semiconductor device according to an embodiment of the inventive concept.

FIG. 16 generally illustrates one type of mobile device (e.g., a smartphone) that may include a complex semiconductor device according to an embodiment of the inventive concept. The smartphone 500 shown in FIG. 16 may employ a complex semiconductor device according to an embodiment of the inventive concept as a memory device for operation and data storage. In this case, the complex semiconductor device 300 may be connected to a terminal controller 510, as shown in FIG. 17

Figure 17:
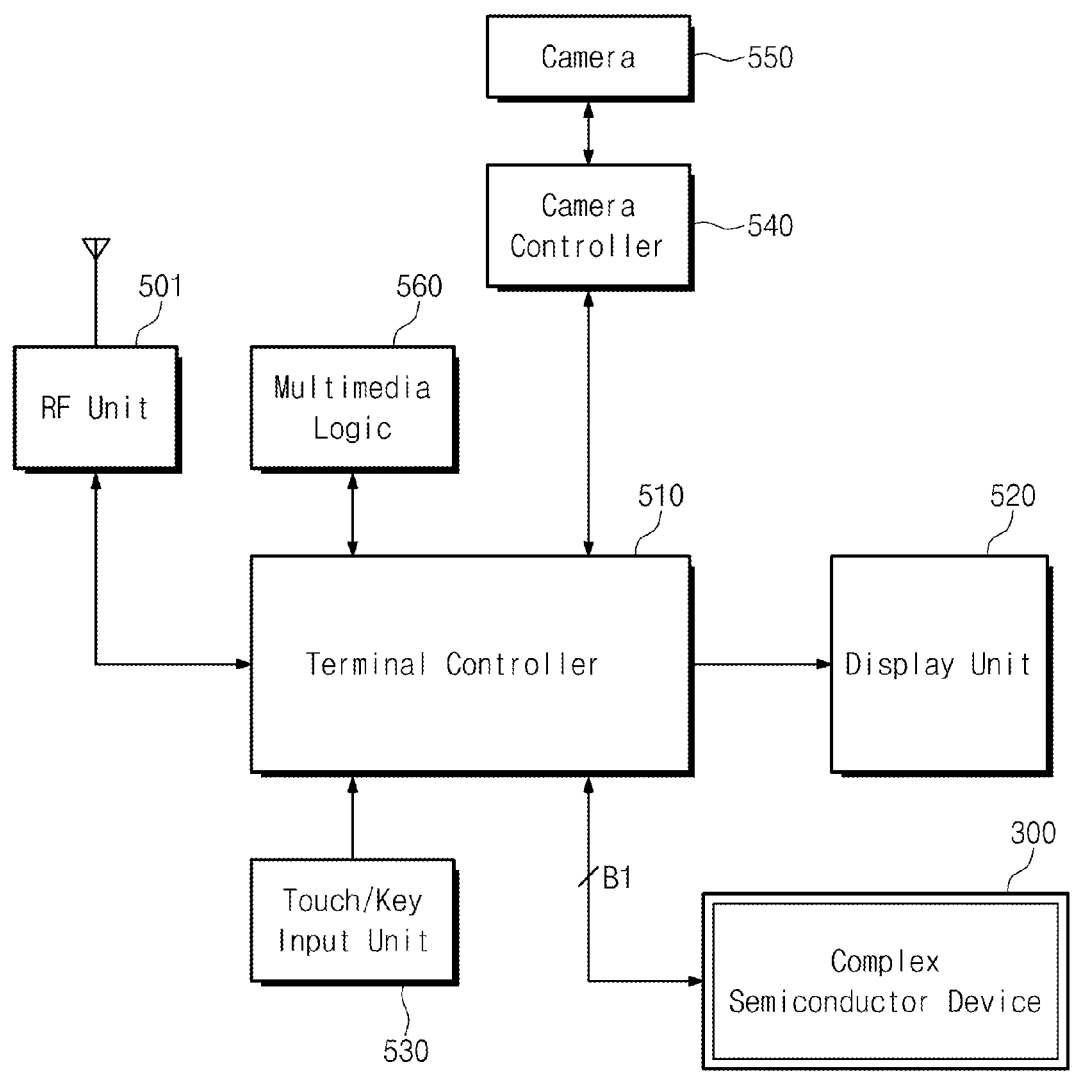
FIG. 17 is a circuit block diagram further illustrating the mobile device of FIG. 16.

FIG. 17 is a block diagram further illustrating the mobile device of FIG. 16. The mobile device 500 may include an RF unit 501, a multimedia logic 560, a touch/key input unit 530, a camera 550, a camera controller 540, a display unit 520, a terminal controller 510, and a complex semiconductor device 300.

The complex semiconductor device 300 serves as a storage for storing multimedia data at the smartphone 500. In this case, since the terminal controller 510 may control or test various memory chips mounted in packages through one controller, it may perform a control operation that is more suitable to various user applications. Moreover, since a complex semiconductor device performs self-test or self-diagnosis based on storage information on the mounted memory chips by itself during power-on, performance of a smartphone is improved.

According to the above-described embodiments of the inventive concept, a complex semiconductor device is suitably and efficiently used in various applications of an electronic device such as mobile equipment. In addition, various memory chips mounted in packages are efficiently controlled or tested through one controller, and a complex semiconductor device performs self-test or self-diagnosis based on storage information on the mounted memory chips during power-on.

While the inventive concept has been particularly shown and described with reference to exemplary embodiments thereof, it will be apparent to those of ordinary skill in the art that various changes in form and detail may be made therein without departing from the scope of the inventive concept as defined by the following claims.

What is claimed is:

1. A semiconductor device configured to receive data from and communicate data to a host, and comprising:
    a multi-chip package (MCP) comprising at least a stacked plurality of memory chips; and
    an embedded multimedia card (eMMC) comprising a controller and a plurality of nonvolatile memory chips configured for mass storage of user data,
    wherein the controller and the plurality of nonvolatile memory chips are commonly disposed on a substrate during fabrication of the eMMC to form a complex semiconductor package,
    the controller is independently and respectively connected to the MCP via a first internal bus and to the plurality of nonvolatile memory chips via a second internal bus,
    the MCP and the eMMC are commonly packaged within a single complex package, and
    the host is directly connected to the MCP via an external bus.

2. The semiconductor device of claim 1, wherein the single complex package is fabricated using package-on-package techniques.

3. The semiconductor device of claim 2, wherein the controller is connected to the external bus via contact terminals having a double-layer arrangement.

4. The semiconductor device of claim 1, wherein the single complex package is fabricated using system-in-package techniques.

5. The semiconductor device of claim 4, wherein the controller is connected to the external bus via contact terminals having a single-layer arrangement.

6. The semiconductor device of claim 1, wherein the stacked plurality of memory chips includes a volatile memory and a nonvolatile memory,
    the volatile memory is one of a mobile DRAM, an EDP, a PRAM, a Pseudo SRAM, an LpDDR-based DRAM, an FRAM, a Graphic DRAM, and a ReRAM; and
    the nonvolatile memory is one of a NAND flash memory, a NOR flash memory, a PRAM, and a ReRAM.

7. The semiconductor device of claim 1, wherein the plurality of nonvolatile memory chips comprises at least one of a NAND flash memory, a NOR flash memory, a PRAM, and a ReRAM.

8. The semiconductor device of claim 1, wherein the external bus is directly connected to only the MCP.

9. The semiconductor device of claim 1, wherein the external bus is directly connected to only the MCP and the plurality of nonvolatile memory devices of the eMMC.

10. The semiconductor device of claim 1, wherein the external bus is directly connected to the MCP, the controller, and the plurality of nonvolatile memory devices of the eMMC.

11. The semiconductor device of claim 1, wherein the single complex package is connected to a terminal controller within a mobile device and configured with the host to function as a storage element storing multimedia data within the mobile device.

12. A semiconductor device configured during testing to receive data from an external tester via an external bus, the semiconductor device, comprising:

a multi-chip semiconductor package (MCP) comprising a stacked plurality of memory chips; and an embedded multimedia card (eMMC) comprising a controller including tester logic and a plurality of nonvolatile memory chips configured for mass storage of user data, wherein the controller and the plurality of nonvolatile memory chips are commonly disposed on a substrate during fabrication of the eMMC to form a complex semiconductor package, the controller is independently and respectively connected to the MCP via a first internal bus and to the plurality of nonvolatile memory chips via a second internal bus, the MCP and the eMMC are commonly packaged within a single complex package, and the external tester is connected via the external bus to communicate data with the tester logic.

13. The semiconductor device of claim 12, wherein the stacked plurality of memory chips includes a volatile memory and a nonvolatile memory, and the plurality of nonvolatile memory chips includes at least one of a NAND flash memory, a NOR flash memory, a PRAM, and a ReRAM.

14. The semiconductor device of claim 13, wherein the controller comprises:

a controller core unit including embedded firmware;

a host interface unit that connects the external bus to the controller core unit;

a multi-chip package interface that connects to the MCP to the controller core unit;

a flash memory interface unit that connects the plurality of nonvolatile memory chips to the controller core unit, wherein the tester logic controls execution of a test operation via the controller core unit directed to one of the stacked plurality of memory chips and the plurality of nonvolatile memory chips during testing of the semiconductor device.

15. The semiconductor device of claim 14, wherein the controller further comprises a register connected to the controller core unit and configured to store information defining the test operation.

16. The semiconductor device of claim 12, wherein the external bus is directly connected to only the MCP.

17. The semiconductor device of claim 12, wherein the external bus is directly connected to only the MCP and the plurality of nonvolatile memory chips.

18. The semiconductor device of claim 12, wherein the external bus is directly connected to only the plurality of nonvolatile memory chips.

19. The semiconductor device of claim 18, wherein the plurality of nonvolatile memory chips comprises a plurality of NAND flash memory chips.

* * * * *